United States Patent
Zach

(10) Patent No.: US 7,861,209 B2
(45) Date of Patent: *Dec. 28, 2010

(54) METHOD FOR INTERLAYER AND YIELD BASED OPTICAL PROXIMITY CORRECTION

(75) Inventor: Franz Xaver Zach, Wappingers Falls, NY (US)

(73) Assignee: International Business Machines Corporation, Armonk, NY (US)

(*) Notice: Subject to any disclaimer, the term of this patent is extended or adjusted under 35 U.S.C. 154(b) by 465 days.

This patent is subject to a terminal disclaimer.

(21) Appl. No.: 11/944,769

(22) Filed: Nov. 26, 2007

(65) Prior Publication Data

US 2008/0086715 A1    Apr. 10, 2008

Related U.S. Application Data

(63) Continuation of application No. 11/221,177, filed on Sep. 7, 2005, now Pat. No. 7,334,212, which is a continuation of application No. 10/665,996, filed on Sep. 18, 2003, now Pat. No. 6,961,920.

(51) Int. Cl.
*G06F 17/50* (2006.01)
(52) U.S. Cl. .............................. 716/19; 716/20; 716/21
(58) Field of Classification Search .................. 716/2, 716/4, 5, 19–21; 430/5, 30; 382/144; 702/81–84
See application file for complete search history.

(56) References Cited

U.S. PATENT DOCUMENTS

| 5,723,233 | A | 3/1998 | Garza et al. .................... 430/5 |
| 5,994,009 | A | 11/1999 | Tzu et al. ...................... 430/30 |
| 6,077,310 | A | 6/2000 | Yamamoto et al. ............ 716/19 |
| 6,194,104 | B1 | 2/2001 | Hsu .............................. 430/5 |
| 6,425,112 | B1 | 7/2002 | Bula et al. ..................... 716/5 |
| 6,470,489 | B1 | 10/2002 | Chang et al. .................. 716/21 |
| 6,553,559 | B2 | 4/2003 | Liebmann et al. ............. 716/19 |
| 6,562,638 | B1 | 5/2003 | Balasinski et al. ............ 438/14 |
| 6,578,190 | B2 | 6/2003 | Ferguson et al. .............. 716/21 |
| 2002/0100004 | A1 | 7/2002 | Pierrat et al. ................... 716/5 |
| 2003/0046654 | A1 | 3/2003 | Bodendorf et al. ............ 716/19 |
| 2003/0139833 | A1 | 7/2003 | Pierrat et al. .................. 700/97 |

*Primary Examiner*—Vuthe Siek
(74) *Attorney, Agent, or Firm*—John A. Jordan

(57) ABSTRACT

An optical proximity correction method is provided using a modified merit function based upon yield. Known failure mechanisms related to layout geometries are used to derive yield functions based upon distance values between layout features, such as, edge features. In comparing the edge points on the predicted layout pattern with the corresponding point on the design layout pattern, a yield test is first undertaken before movement of the points on the predicted layout pattern to a position of higher yield. Where yield is acceptable, no further movement is made. Where incremental movement of points results in coming within acceptable proximity before acceptable yield is reached, the point is flagged for further consideration.

6 Claims, 10 Drawing Sheets

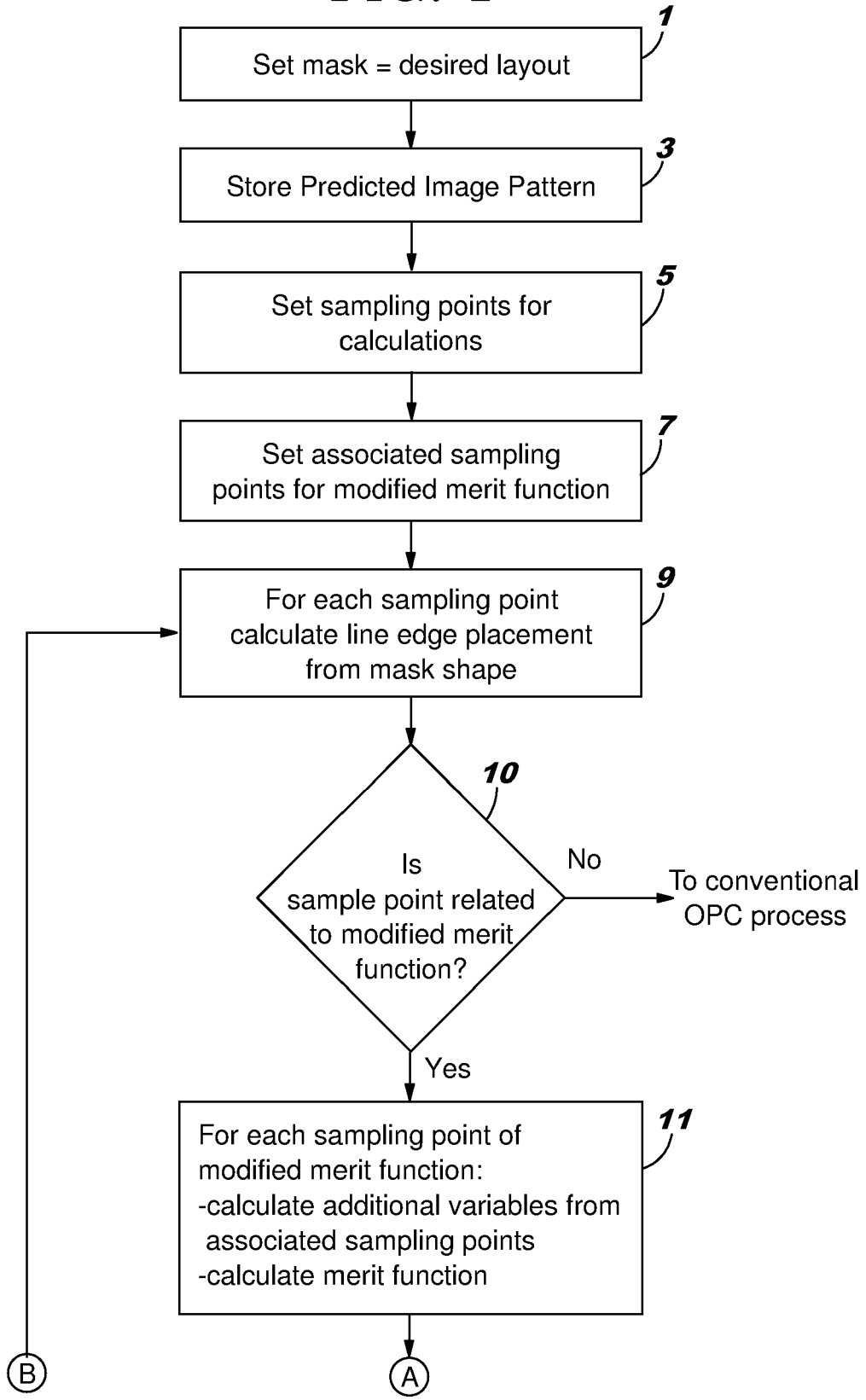

METHOD FOR INTERLAYER AND YIELD BASED OPTICAL PROXIMITY CORRECTION

This application is a continuation application of U.S. patent application Ser. No. 11/221,177, filed Sep. 7, 2005, now U.S. Pat. No. 7,334,212 which application is a continuation application of U.S. patent application Ser. No. 10/665,996, filed Sep. 18, 2003 and allowed on Jul. 28, 2005, now U.S. Pat. No. 6,961,920.

BACKGROUND OF THE INVENTION

1. Field of the Invention

The present invention relates to semiconductor fabrication and, more particularly, to an improved method for creating mask patterns for use in lithographic processing of integrated circuits (ICs).

2. Background and Related Art

Integrated circuits are fabricated by lithographic techniques where energy beams transmit integrated circuit images or patterns on photomasks onto photosensitive resists on semiconductor wafer substrates. This lithographic transfer of mask patterns into photoresist, development of the photoresist, followed either by ion implant or etch processes is a standard process for creating chips. However, this process is not only limited in its pattern fidelity due to the small size of the patterns being printed relative to the wavelength of the light used, but it is also limited by a variety of other nonlinear effects involved in the overall process. Thus, in addition to the limited resolution of the optical image process, the shortcomings of the pattern transfer process used to build a mask, the nonlinear nature of the chemical processes within the resist and during developing as well as pattern density dependencies of the etch process, all contribute to distorting the final on wafer result relative to the original design.

Optical proximity correction is a methodology by which the distortions of the pattern transfer process are corrected such that the final on-wafer result resembles as close as possible the desired design. This is accomplished by creating a more or less empirical model that describes all the above mentioned process effects, carefully characterizing the process and using this model to modify the pattern on the reticle relative to the original design such as to counteract the distortions.

Optical Proximity Correction (OPC) has thus been employed as a key enabling resolution enhancement technique required to meet image size control requirements imposed by state-of-the-art integrated circuit product programs. OPC, then, is essentially the deliberate and proactive distortion of photomask patterns to compensate for systematic and stable errors. OPC is generally categorized as either rules-based or model-based. Rules-based OPC is accomplished by determining the correctable imaging errors, calculating appropriate photomask compensations, and finally applying the calculated corrections directly to the photomask layout. While proven to be efficient at correcting some important one- and two-dimensional imaging problems, non-iterative rules based OPC is generally believed limited in its usefulness due to the finite number of rules that are available to describe all layout situations, the difficulty of calculating exact correction values based on measured errors, and the lack of feedback loop during the correction process.

Existing model-based OPC tools overcome some of these shortcomings by employing an iterative optimization approach. Model-based OPC is predicated on the concept of capturing the imaging characteristics in a mathematical model, or a combination of mathematics and heuristics, and calculating only the expected or predicted on-wafer circuit image which would be projected by the mask pattern under investigation. The correction to be applied is never directly calculated. Rather, the correction is derived by comparing the simulated predicted image contour placement to the edge placement of the original mask pattern and iteratively adjusting until a match or near match is found or until all iterations are exhausted. An example of such process has been described in U.S. Pat. No. 6,578,190.

The goal of the most common approaches to modifying mask patterns, whether it be rules-based or mode-based, is to ensure the layout patterns are replicated within the specifications assumed by the circuit designer. In some cases, efforts have been made to ensure that the patterns are reproduced over the largest possible lithographic process window (i.e., range of dose and defocus). However, this approach still results in deficiencies in producing circuit patterns. Circuit layout follows a set of design rules that specify limits and allowed ranges of pattern dimensions. Due to the strong desire to provide the smallest chip dimensions possible, certain minimum geometries might be allowed in the design rules even though they may not be optimum to achieve the highest yield. Quite frequently the particular layout chosen is dictated by convenience rather than optimum yield or space restriction. Minimum geometries are chosen due to limitations in the automated layout generators rather than space restrictions. Thus, it is highly desirable to eliminate such yield limiting geometries wherever they are not absolutely required.

Thus, although the design chosen is one based upon a generic set of design rules that have been established to eliminate layout geometries that cause failure, non-perfect automation tools used to create the layout and the fact that design rules have been written with the most generic design in mind, most layout designs can be further modified from the circuit designers' layout version to one that is more optimized in terms of yield. Accordingly, process results that show failure mechanisms due to circuit layout geometries within the generic set of design rules may be translated into yield functions that can be used to further define and optimize changes to the mask layout in a model-based OPC tool.

SUMMARY OF THE PRESENT INVENTION

In accordance with the present invention, yield-based optimization of layout design parameters is employed in model-based OPC. Model-based OPC systems employ an iterative optimization process wherein simulated image contour placement is compared to the edge placement of the original design pattern, and feedback corrections are made until a satisfactory match is found. In accordance with the present invention, the image contours are evaluated for a set of sampling points located on the original design, along with the image contours of associated sampling points that relate to process-identified yield factors. The term 'associated' is intended to indicate that each sampling point has associated with it, a set of additional sampling points. The associated sampling points are required since the yield functions use variable such as the width of a line, the width of a space, distance to a contact or other interlayout conditions. Since these variables are related to distances, more than one point in the design is required. These same variables are used to define a merit function embodied in yield functions derived from process information, such as, yield as a function of linewidth and space between lines, or interlayer layout conditions.

After a first pass wherein corrections and movement of edges toward improved yield, a new mask image is created and the OPC process tool again runs a simulation of the mask pattern image which will be created on the substrate, and generates a new predicted image contour. The process then continues to operate on sampling point values that are represented in yield functions until the values are either at or near maximum or have arrived at a satisfactory match with the original mask pattern design. By using such an approach, the OPC process converges on an optimum layout rather than solely the original design layout.

Yield curves that are defined by other layout variables, such as overlay error-induced edge placement variations, interlayer contact coverage variations and gate/linewidth variations due to interlayer reflectivity, may be used to define additional merit functions upon which the OPC process may converge. Related merit function may also be combined to provide a final yield function.

It is, therefore, an object of the present invention to provide an improved lithographic processing of integrated circuits.

It is a further object of the present invention to provide an improved optical proximity correction process and apparatus.

It is yet a further object of the present invention to provide a yield-based optical proximity correction process and apparatus.

It is yet still a further object of the present invention to provide new merit functions in a model-based optical correction process wherein such new merit functions are based upon identified process yield factors which are used to control formation of a mask layout to thereby optimize the mask to yield rather than design layout.

It is another object of the present invention to provide an optical proximity correction method and apparatus that incorporates therein yield functions related to circuit layout geometries likely to cause failure whereby feedback corrections are based upon maximizing geometric yield relationships, such as, a yield function related to linewidth and spacewidth between lines.

These foregoing and other objects, features and advantages of the invention will be apparent from the following more particular description of a preferred embodiment of the invention, as illustrated in the accompanying drawings, wherein like reference members represent like parts of the invention.

DETAILED DESCRIPTION

Figure 1:
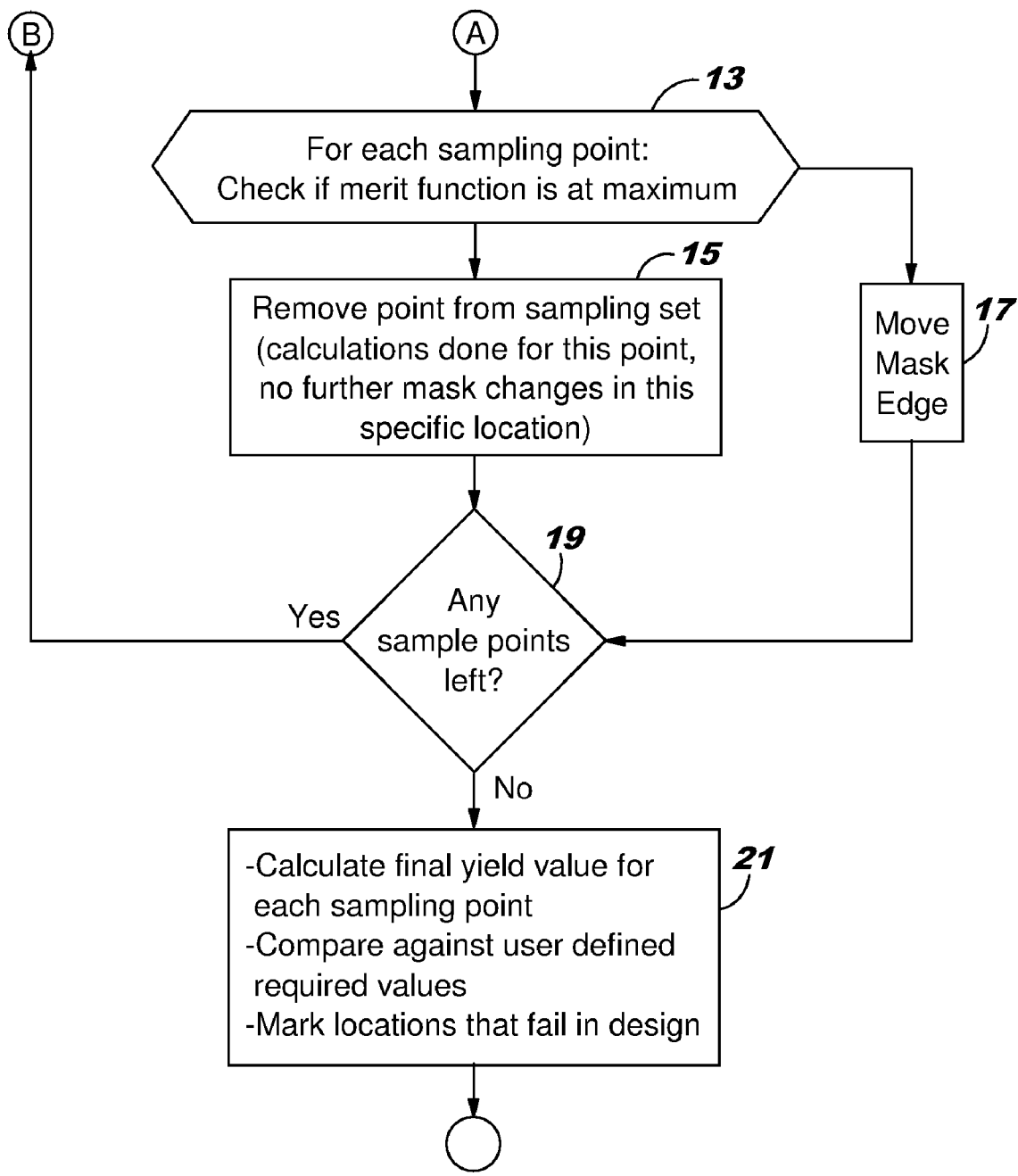
FIG. 1 shows a flow chart of the OPC process, in accordance with the present invention.

With reference to FIG. 1, there is shown a flow chart embodying one possible manner in which a conventional model-based OPC process may be modified, in accordance with the present invention, to implement a yield based process that converges on an optimum layout rather than on the original design layout.

In this regard, conventional model-based OPC tools optimize to the original design layout by the iterative process of comparing a predicted wafer image to the design layout. To achieve this, the actual circuit pattern design layout to be reproduced on a substrate layer is created on a mask. An existing OPC tool then runs a simulation on this pattern and predicts the actual wafer pattern image that would be transmitted onto the wafer substrate, taking into consideration optical proximity effects, and the like. The OPC tool then compares this predicted wafer image with the original circuit design layout, determines the required adjustment of the mask pattern so that the mask and wafer images are more closely aligned. After a first pass correction and movement of edges that do not agree, a new mask is created. The OPC tool then runs another simulation of the mask pattern image which will be created on the wafer substrate to generate a new predicted wafer image. The process continues until the predicted wafer image is within acceptable bounds of an optimized window.

The problem with such an approach is that it ignores the fact that the original circuit design layout may not be an optimum design from the standpoint of actual yield results of processed wafers. In accordance with the present invention, it is recognized that certain layout geometries are susceptible to failure and such geometries may be represented by variables that translate into yield functions derived from process knowledge, testing or modeling. Accordingly, the difficulty with the conventional OPC approach is it acts to drive the OPC process toward conformity with contour or feature values of the original design layout rather than toward conformity with layout values known to produce improved yield. Thus, in conventional OPC processes, iterative line movement of the predicted wafer image edge toward values that conform to the design contour or feature values may be away from the point of maximum yield. Stated another way, if the current position of a sampling point on the contour of the predicted wafer image is at or near maximum on a yield curve, then further movement of the predicted wafer image edge toward conformity with the original design image is unnecessary and, indeed, counterproductive. On the other hand, a yield-based system operates at this point in time to end sampling of this point on the contour of the predicted wafer image while other sampling points on the contour of the predicted wafer image may continue to be processed.

In accordance with present invention, the conventional OPC process is modified to employ a yield-based merit function derived from process knowledge which merit function is used for comparing values derived from the sampling points on the predicted wafer image. In this regard, such yield functions may be derived from the variables involved in a variety of known failure mechanisms. Various approaches may be used to derive yield functions.

Figure 2:
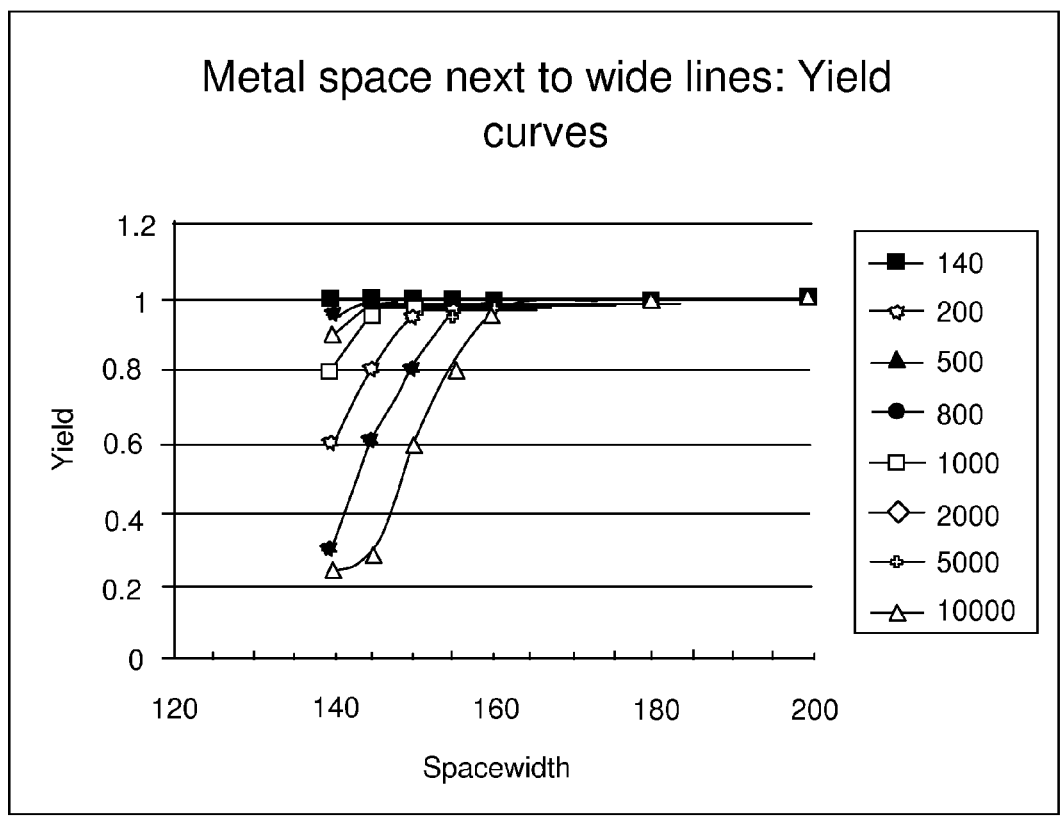
FIG. 2 shows yield curves for a a metal space sandwiched between two metal lines. Yield is plotted as a function of the spacewidth on the x-axis.

For example, test macros may be employed to experimentally determine yield functions. Such test macros may be designed to specifically simulate failure situations. For example, a test macro may be developed to establish the yield curve for two large metal blocks separated by a narrow space. Such a macro would act to test current flow between the metal blocks. Current flow would occur if some process variation creates a bridge or connection between the metal blocks. For example, process variations, such as, focus variations in lithography causing resist collapse or incomplete chemical mechanical polishing leaving residual metal between the metal blocks, may cause current flow between the blocks. Specific variations in metal widths and metal spacing may be run to determine how the process variations affect yield. FIG. 2 shows one such type of yield curve for linewidth vs. linespace (space between a pair of lines). Alternatively, either through simulation or experiment, focus and dosage values may be varied to determine at what values a given structure fails.

Again, with reference to FIG. 1, the process in accordance with the present invention begins in conventional manner with the step of creating and storing a design mask pattern equal to the design layout, as shown by "set Mask=desired layout" in block 1. An existing OPC tool then runs a simulation on the mask pattern and predicts what the actual wafer pattern image would be after optical projection onto the wafer substrate. The predicted wafer pattern image is then stored, as shown by block 3. Sampling points along the predicted wafer pattern image edge are then defined and set, as shown by the step of block 5. In this regard, sampling points may be selected in accordance with the degree of change in the pattern layout and where layout features are prone to failure. For example, where the pattern changes rapidly, more samples may be taken than where straight lines are involved. Where a standard OPC process is employed, the position of the sampling points on the predicted wafer pattern image edge are compared to the position of corresponding points on the design mask pattern image edge. If the position of the two points is within some predetermined range of one another, sampling of this point terminates. Thus, the merit function here is solely based upon the distance between the two points being within a certain specified tolerance of one another.

In accordance with the present invention, this proximity merit function is augmented by a modified merit function based upon a yield function derived from prior knowledge of failure mechanisms due to the geometric location or position of particular features along this sampling line. This necessitates defining additional sampling points along the sampling line which points are characterized as "associated sampling points" in block 7.

Figure 3:
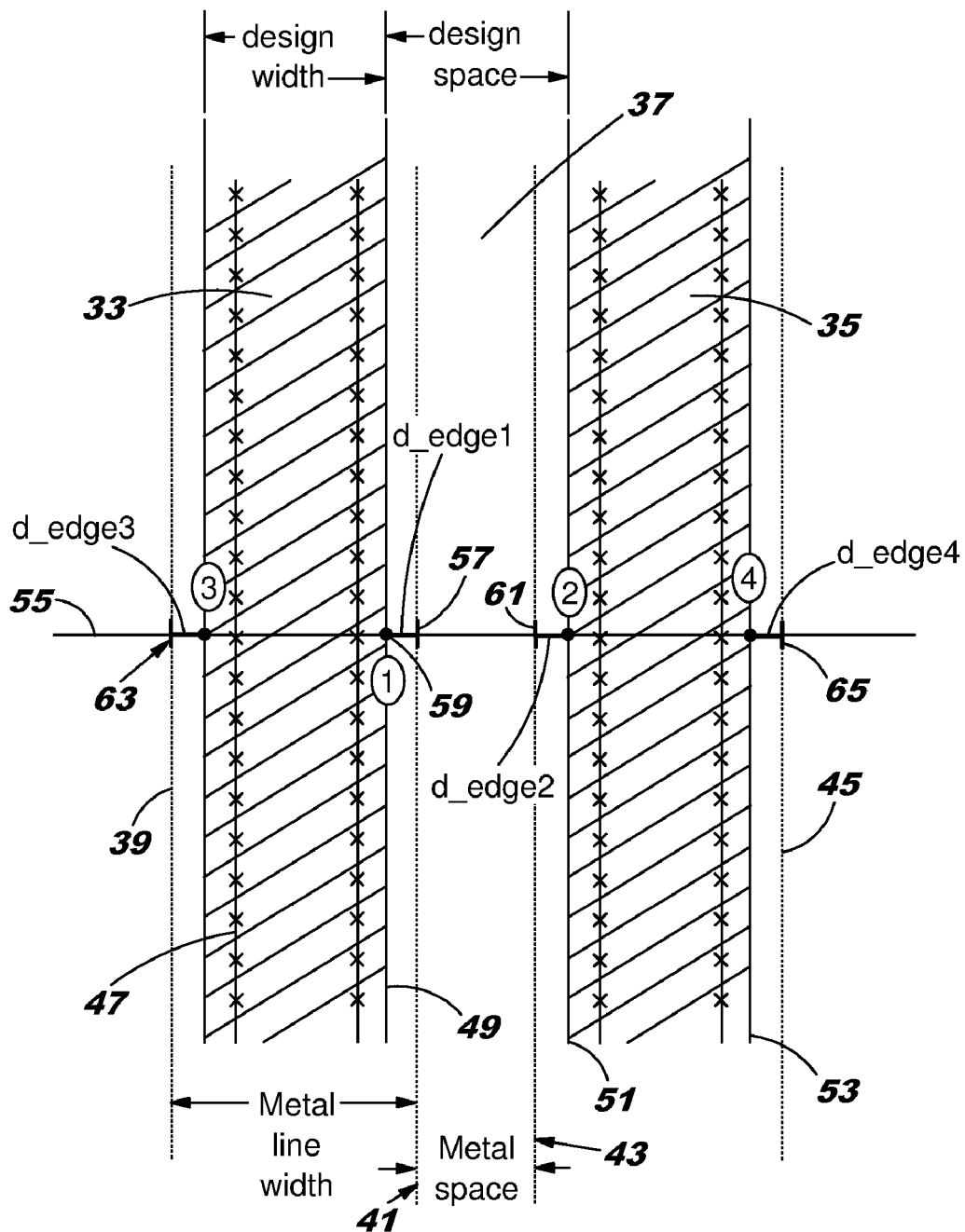
FIG. 3 shows how sample points for a modified merit function are taken in a typical linewidth/spacewidth example.

The associated sampling points may be explained more fully with reference to FIG. 3. FIG. 3 shows a sampling pattern for a pair of metal lines with an insulating space between them. FIG. 3 represents what might be thought of as a snapshot of a portion of the total layout at some point in the process. The metal lines are depicted by shaded regions 33 and 35 and represent the design width of the metal layout. The region 37 between shaded regions 33 and 35 is the design space between the metal lines. The dotted lines 39, 41, 43 and 45 represent the position of the predicted wafer pattern image edges of metal lines 33 and 35 and the solid lines 47, 49, 51 and 53 marked with X's represent the current mask edges from which the present predicted wafer pattern image edges were derived. By this, it is assumed at least one pass has been made to provide a current mask pattern modified from the original design mask pattern. Line 55 represents the current sampling line.

In a conventional OPC process, the position or value of predicted wafer pattern image sampling point 57 on sampling line 55 would be compared with the position or value of point 59 of corresponding design pattern image, i.e., the predicted edge point would be compared to the corresponding design edge point to determine the distance therebetween. However, since there are known failure mechanisms associated with metal linewidth and the spacewidth between metal lines, in accordance with the present invention associated sampling points 61, 63 and 65 are identified from which linewidths and line spaces can be determined.

Since the distance between each of sampling points 57, 61, 63 and 65 and its corresponding point on the design pattern image, identified respectively as d_edge1, d_edge2, d_edge3 and d_edge4 in FIG. 3, is known (i.e. can be computed), then the width of the predicted line widths can be determined. Thus, predicted metal linewidth=design linewidth +d_edge1+d_edge3 and metal spacewidth=design spacewidth−d_edge1−d_edge2.

FIG. 2 shows yield curves as a function of linewidth and spacewidth (x-axis) variations over the ranges shown, with different symbols representing different linewidths from 140 to 10,000 nm. In this particular example, it is assumed that yield (in this case determined to be shorting between the metal lines) becomes a strong function of spacewidth for wide metal lines. It can be seen that yield is near maximum for all linewidths if the space is above approximately 160 nm. The minimum required space needed to obtain near optimum yield becomes smaller as the linewidths become smaller. From a yield perspective it is desirable to widen the space by moderate amounts in the case of wide metal lines. The layout of FIG. 2 is for illustrative purposes only, and shows that a relatively small reduction in the linewidth (increase in space) has little impact on functionality but a large impact on yield.

Figure 3A:
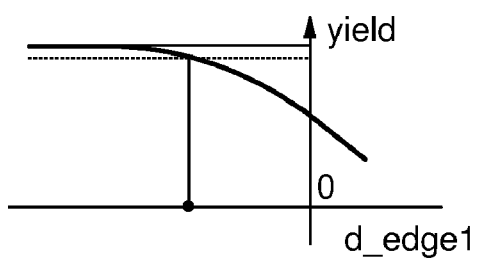
FIG. 3A shows a simplified yield curve for the example of FIG. 3.

For further description, reference is made to the layout according to FIG. 3 and the flow diagram of FIG. 1, starting with block 9. In the initial steps of the algorithm, sampling points (step of block 5) have been picked, as shown at points 1, 2, 3 and 4 along the design width lines. The set of associated sampling points for point 1 includes point 3 and 2 defining the width of the space and the width of the line (step of block 7). It is assumed that the new edge placements have been calculated, i.e., points 63, 57, 61 and 65 are known based on the mask layout (lines 47). It is also assumed that the quality of the edge placement for point 1 is being evaluated. As shown in FIG. 3, the merit function is a function of the linewidth (distance between points 63 and 57) and the space (distance between points 57 and 61). Since we are looking at point 1, the algorithm has to decide whether or not the current position of point 57 is optimum (or close to optimum) in terms of yield. This question is answered by looking at the yield function as a function if d_edge1. For this particular iteration d_edge2, d_edge3, d_edge4 are all known and are kept fixed. Therefore the yield function depicted in FIG. 2 can be converted to a merit function of d_edge1 only which is schematically shown in FIG. 3a. The question the process of FIG. 1 addresses is; how close is the predicted edge placement d_edge1 to the edge placement which would result in maximum yield? This question is addressed in steps shown by blocks 9, 10, 11 and 13 in FIG. 3. Then, in the steps of block 11, the value of the variables from the associated sampling points and the related merit function is calculated. In this regard, block 11 references a "modified merit function". This term is used to distinguish the process in accordance with the present invention from that of the conventional OPC process wherein the merit function is merely one of distance.

The step represented by block 13 then checks to see if the calculated merit function value is at a maximum by checking the values of the merit function over the allowed range of edge_movements relative to the present value. Referring to the FIG. 3a example of a merit function using d_edge1 only, if the predicted spacewidth (negative values of d_edge1) results in values of the merit function above the dotted line, then this sampling point is removed from the sampling set and no further changes are made at this specific location. Such a step is represented by block 15 in FIG. 1.

On the other hand, if the value of the calculated merit function for the sampling point in question is not at maximum, within a predefined tolerance, the mask edge point associated with the sampling point in question is moved closer to the point of maximum as shown by the step of block 17. The process then continues by determining if there are sampling points left, as shown by the step of block 19. If there are sampling points left in the set of sampling points defined in the step represented by block 7, the process continues to the next sampling point.

In this regard, the initial set of sampling points defined in the step of block 5 may comprise several series of points that relate to various distinct geometric layout conditions or features known to exhibit some form of failure mechanisms that are embodied in yield curves derived therefor. Sampling points may also be defined between these distinct layout conditions or features embodied in modified merit functions wherein such sampling points are processed in conventional OPC fashion to bring the edge of the predicted wafer pattern image within acceptable proximity of the design pattern image. Alternatively, the process may be run on only modified merit functions wherein the "No" response in the step of block 10 would not be operative or alternatively, the step of block 10 would be removed.

Whether only the modified merit function in accordance with the present invention is used, or both the conventional merit function of distance and the modified merit function are used, the process loops back to the step represented by block 9 to calculate the next line edge placement position from the predicted mask image. The step represented by block 10 then determines whether the line edge placement position for this sampling point relates to a modified merit function test based on yield or conventional OPC merit function test based on distance. Thus, the process shown in FIG. 1 can be viewed as an alternative loop in the conventional OPC process or viewed as a new embodiment or application of the conventional process.

Regardless of how embodied, the essential feature of the process in accordance with the present invention is the use of a modified merit function in a conventional OPC process which merit function is based upon a yield test. The yield test demonstrated in FIGS. 2 and 3 is only an example of one possible yield test, and it is clear that any of a variety of tests based upon yield might be employed in a single process. Where such are employed, it is clear that the final yield would be the product of all yield tests at the end of the overall process where all edges have been moved to their final positions. Where merit functions calculated at the end of the process are below a predetermined threshold as determined by user defined values, for example, the site of these merit functions can be flagged or marked for various further actions, such as, process or design adjustments. Such step is shown by block 21 of FIG. 1.

Figure 4:
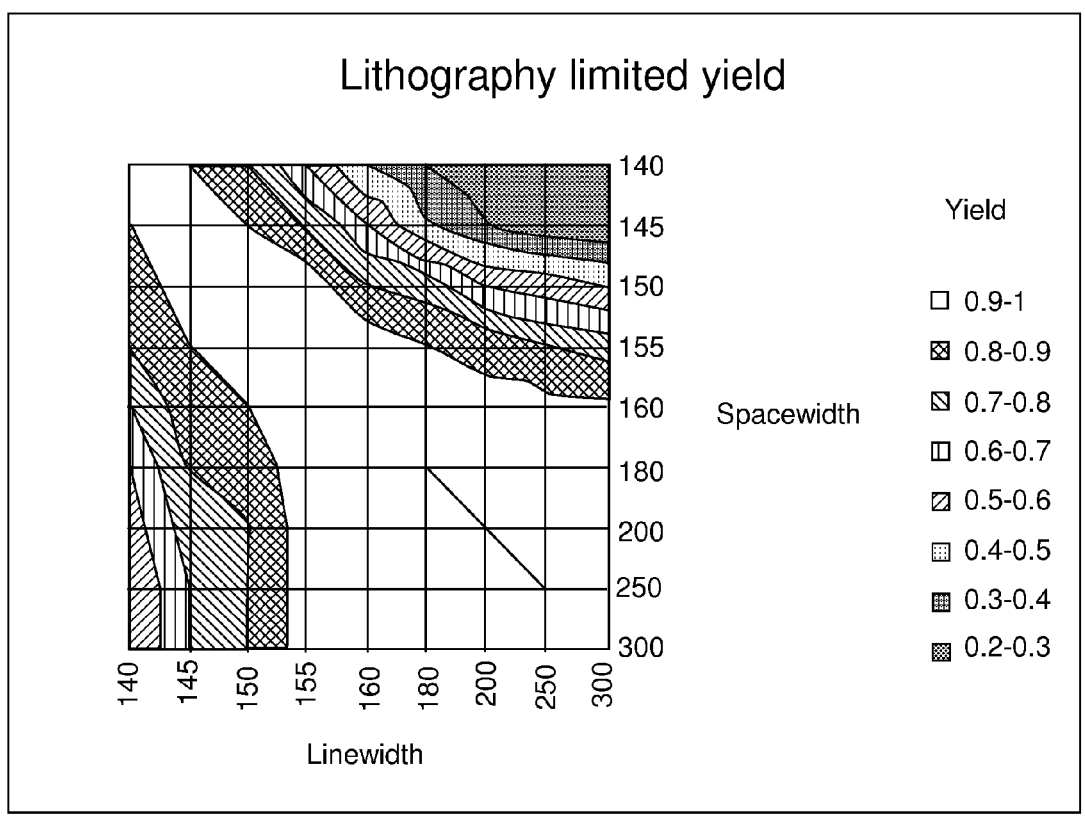
FIG. 4 shows lithography-limited yield curves as a function of spacewidth, linewidth in a regular array of lines/spaces.

As a further example of a merit function based upon yield that may be employed as a modified merit function, in accordance with the principles of the present invention, reference is made to the yield curves shown in FIG. 4. Shown there is an example of yield curves for lithography limited yield as a function of linewidth (i.e., the metal width) vs. spacewidth (i.e., the oxide width) for a given metal layer process. The curves can be derived using process window information and assumptions on process control for dose and focus on the exposure tool. The layout arrangement represented by FIG. 4 is again one of lines and spaces in nm. Failure in the range of linewidths and spacewidths is assumed to occur if the linewidth is outside a certain percentage of a target linewidth. Furthermore, it is assumed that the linewidth variations are driven by process induced changes in dose and focus for the lithography process used. The lithographic process window is defined as an allowed area in the dose/focus plane where the above-mentioned linewidth conditions are fulfilled. Dose/focus variations are considered to be random. However, similar calculations can be made if systematic variations in dose and focus control the lithography process. Yield is the percentage of dose/focus values within the allowed area. Thus for each combination of lines and spaces, a yield number can be calculated. Since the lithographic process window depends on the geometries used, yield curves such as the one shown in FIG. 4 result. As can be seen, the yield drops off more dramatically for isolated spaces than isolated lines. The curves can be derived using process window information and assumptions on process control for dose and focus on the exposure tool. As a modified merit function, it can be used the in process described in accordance with the present invention to test for optimum yield with respect to combinations of linewidth vs. spacewidth.

Figure 5:
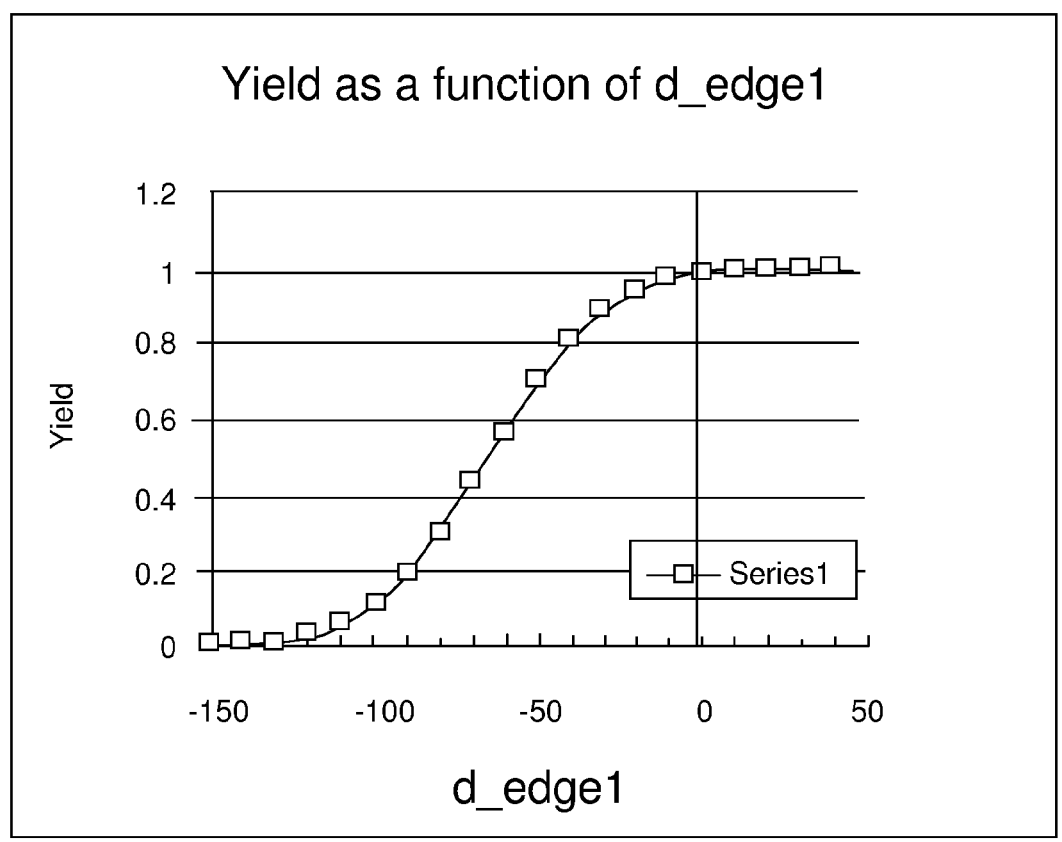
FIG. 5 shows a yield curve as a function of edge placement error.
Figure 6:
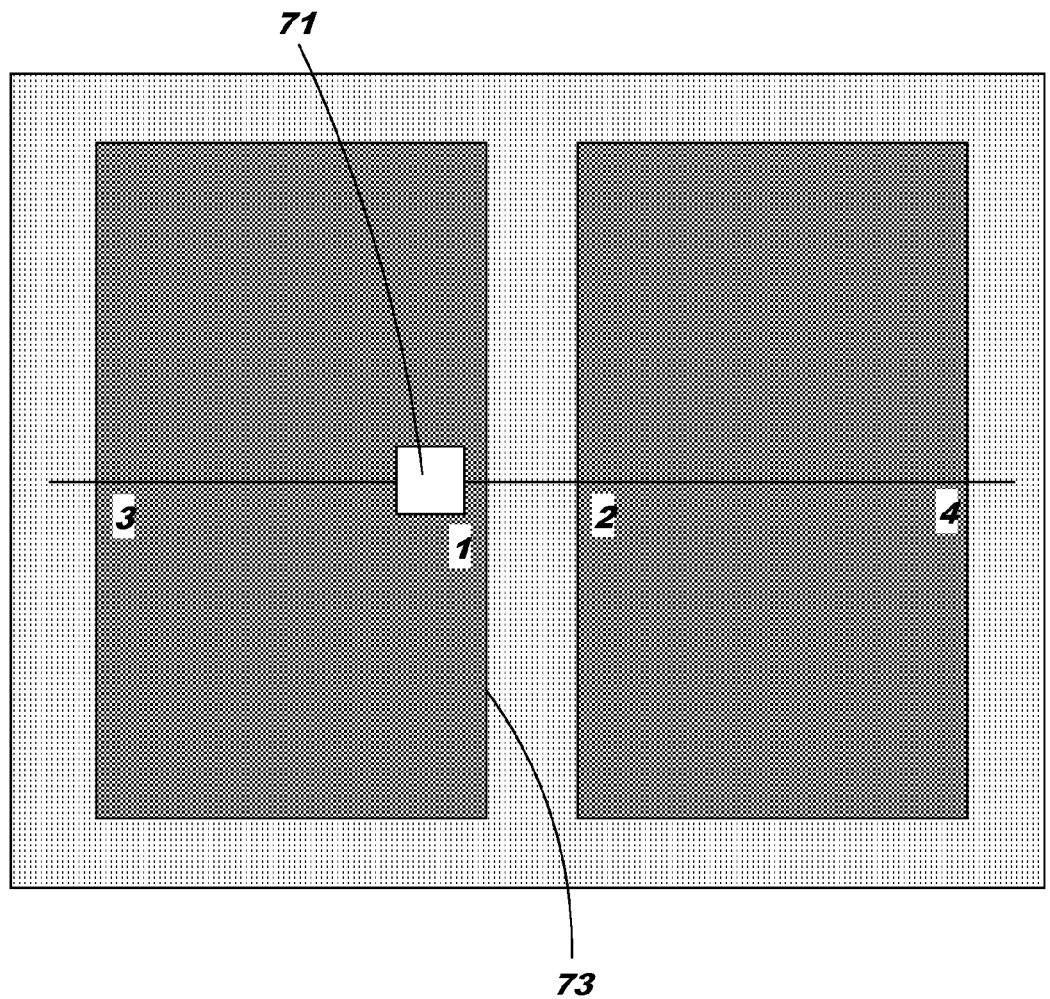
FIG. 6 represents the placement of an interlevel contact with respect to a metal line.

Another example of a merit function based upon yield that may be employed as a modified merit function, in accordance with the principles of the present invention, is shown in FIG. 5 and based on the layout arrangement shown in FIG. 6. FIG. 6 shows an extension of the layout concerns depicted in FIG. 3 involving wide metal lines with a narrow space between them. However, in this case, a contact 71 is placed near edge 73 of the first metal line. The sampling point 1 and associated sampling points 2, 3 and 4 are similarly positioned as in FIG. 3. Additional yield concerns here are achieving sufficient contact coverage for sufficiently low contact resistance. In this example, it is clear that interlevel parameters involving placement and lithographic control information, such as overlay, are involved in positioning the contact and metal lines. Yield curves based upon the extent of contact coverage versus failure may readily be developed to formulate a modified merit function for this example.

For example, in addition to the linewidth/linespace merit function described with regard to FIG. 3, the same variables may be used to define a merit function based upon distance between the metal line edge 73 and contact 71. The yield function in this case may be constructed, for example, by taking a minimum required contact coverage of, for example, 50% and assuming Gaussian distribution for the overlay tolerance. The yield would then be a function of the distance between metal edge 73 and the center of the contact:

$$d\_contact = \text{distance}(\text{metal edge} - \text{center of contact}) + d\_edge1$$

where d_edge1 is the edge placement error at point 73. The overlay performance translates into a yield curve (cumulative Gaussian).

FIG. 5 shows such a yield curve based upon edge movement, d_edge1, relative to the design edge at 0. Thus, it can be seen that too large of an edge movement (in negative direction) can significantly impact yield since the contact coverage suffers. So, while the yield function would have widened the space, the additional contact coverage requirement will significantly reduce widening of the space. Testing against such a merit function can also be used as a safeguard for too much movement. Various implementations are possible using edge placement error as the only input variable. It can be seen that the previous yield curves for various linewidths and spacewidths show, in general, yields increasing with increasing spacewidth. Since the yield function of FIG. 5 shows higher yield for smaller edge movement, this function is predicated upon retaining the original layout. Thus, a generally optimized solution would be found by trading off between these countering yield functions.

Figure 7:
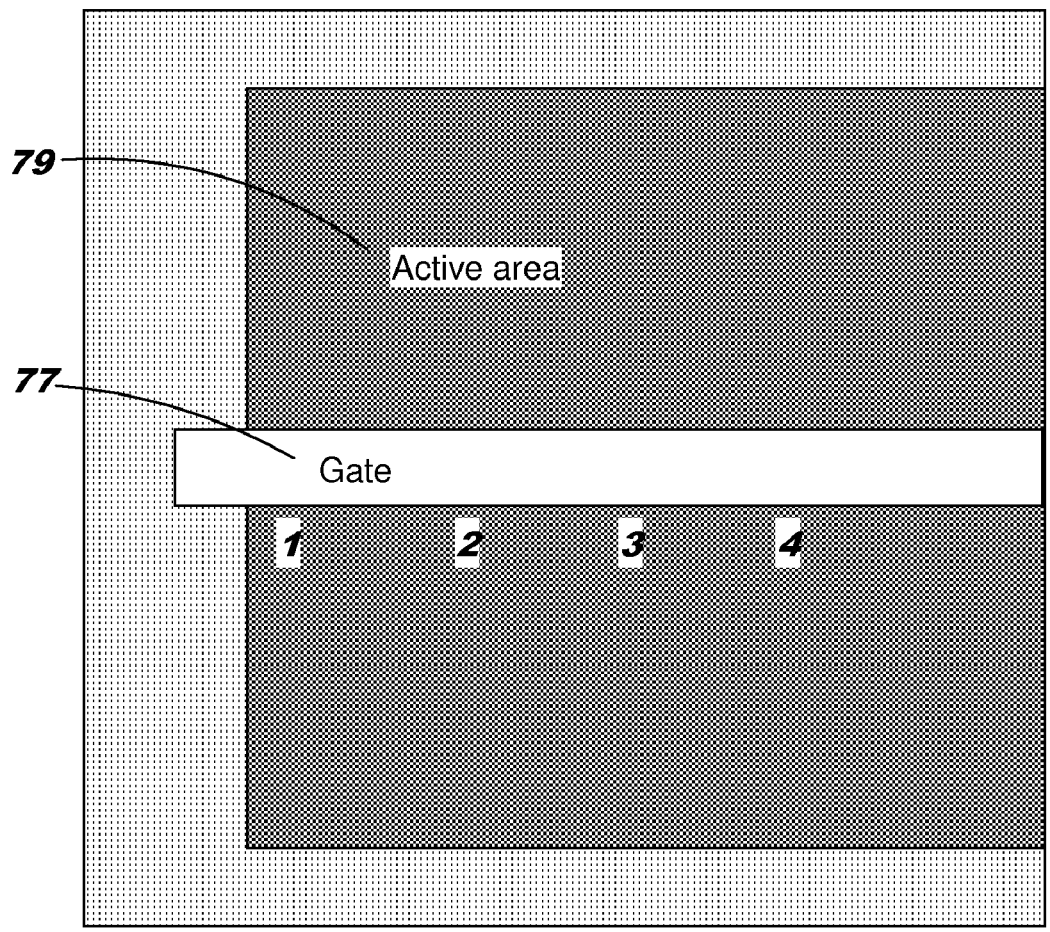
FIG. 7 represents the placement of a gate with respect to the active area of a device.
Figure 8:
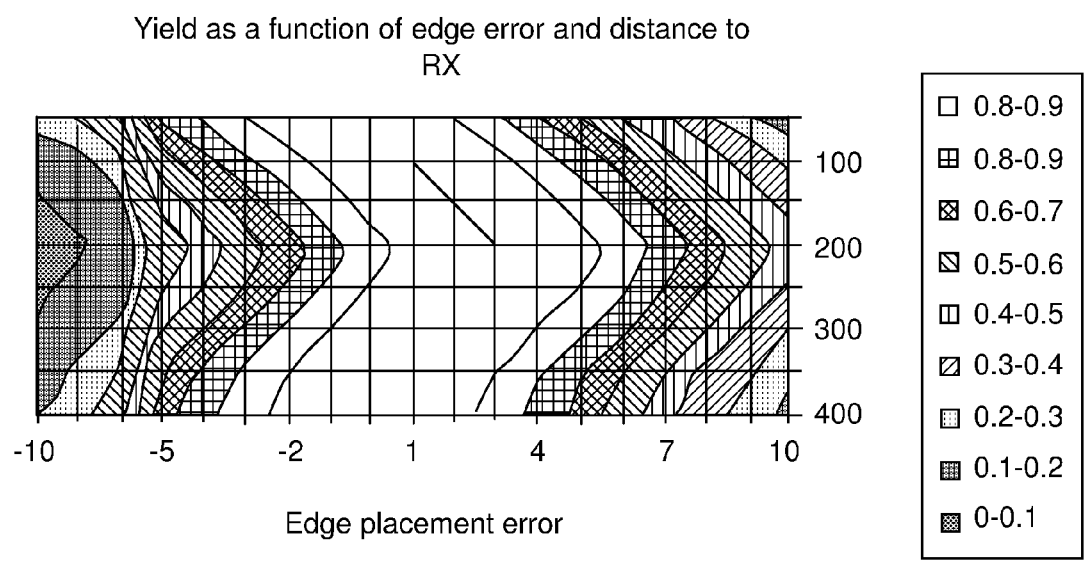
FIG. 8 shows yield curves as a function of edge placement error and distance to RX.

FIG. 7 shows a common layout pattern where a gate line crosses over active area. The possible failures here may be due, for example, to reflectivity mechanisms due to underlying substrate effects. As shown, gate 77 crosses an active area 79 which may be subject to reflectivity variations caused by an underlying substrate. This may result in an undesirable linewidth variation affecting gate performance. As can be seen, the same sampling approach as used in FIG. 3 may be used here over the linewidth of the gate. Thus, the variables for each sampling point would involve the edge placement error of the gate and the distance to the edge of the active area. The yield curves for such conditions are shown in FIG. 8. In this configuration, it is assumed that a difference in height is present at the boundary between active area and surrounding oxide. In a typical gate process, this step would be covered by the gate stack upon which an anti reflective material and resist is coated during the gate lithograph process. The planarization properties of the organic coatings used, lead to reflective notching of the gate at some distance from the boundary between active area and oxide. This distance is plotted on the y-axis of FIG. 8. Yield in this arrangement is determined by the capability to maintain the desired gatewidth within a certain typically very narrow tolerance. In order to maintain optimum yield, a counteractive widening of the gatewidth at a distance of approximately 200 nm from the edge is required to maintain optimum yield, as shown in FIG. 8.

There are a variety of ways to implement the steps involved in carrying out the present invention. In its simplest form, the invention could be carried out with simple modifications to existing OPC tools. Such modifications would involve setting additional sampling points and for each sampling location, calculating variables from the additional sampling points and comparing these variables with merit functions based upon yield. Any of a variety of merit functions could be used, some examples of which have been described above.

Figure 9:
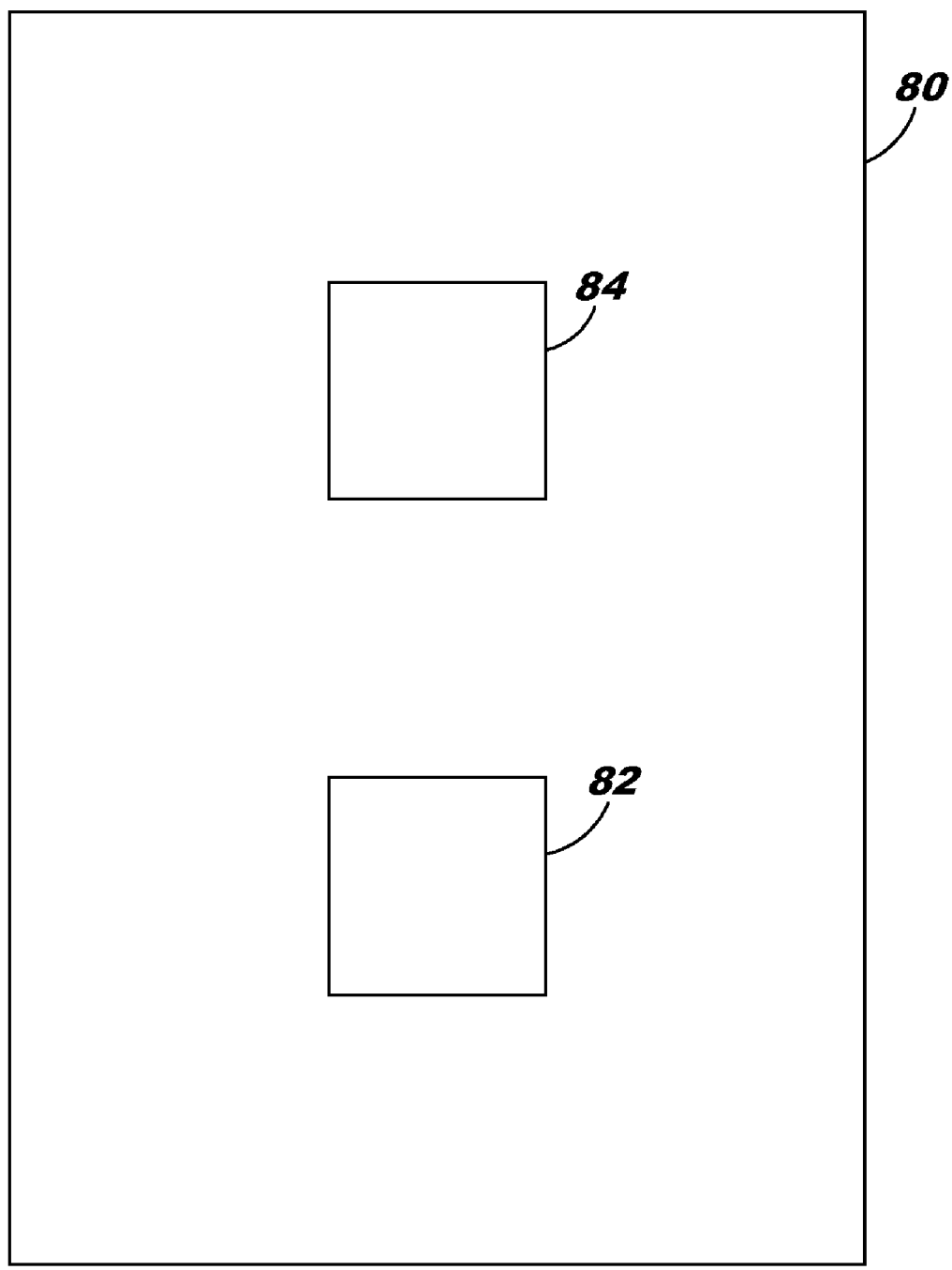
FIG. 9 shows a computer arrangement that may be employed for carrying out a program embodiment of the process described, in accordance with the principles of the present invention.

It should be understood that the method of the present invention may be embodied as a computer program product stored on a program storage device. This program storage device may be devised, made and used as a component of a machine utilizing optics, magnetic properties and/or electronics to perform the method steps of the present invention, as is known to those skilled in the art. Program storage devices include, but are not limited to, magnetic disks or diskettes, magnetic tapes, optical disks, Read Only Memory (ROM), floppy disks, semiconductor chips and the like. A computer readable program code means in known source code may be employed to convert the methods described for use on a computer. The computer program or software incorporating the process steps and instructions described may be stored in any conventional computer, for example, that shown in FIG. 9. Computer 80 incorporates a program storage device 82 and a microprocessor 84. Program storage device 82 may have installed thereon the program code incorporating the method of the present invention, as well as any database information for the various feature patterns, such as the design or layout mask pattern and predicted wafer patterns, as well as yield functions and lithographic process window information and the like and to formulate a mathematical model to predict wafer patterns.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

What is claimed is:

1. A system for creating a mask adapted for use in lithographic production of layout features on a substrate, comprising:
    storage means for storing a design mask pattern of the design layout pattern to be created on the substrate;
    storage means for storing a predicted layout pattern from the design mask pattern of what would be created on said substrate using said design mask pattern;
    processor means for successively sampling selected points of related contour edge features across said predicted layout pattern and said design mask pattern to calculate distance values between respective ones of said contour edge features;
    storage means for storing information representing yield curves as a function of said distance values between said contour edge features;
    processor means for determining from said stored information representing yield curves whether for each selected sampling point the current position of the contour edge feature of said predicted layout pattern is at a position that provides acceptable yield; and
    processor means for incrementally moving the said current position of contour edge feature of said predicted layout pattern toward an edge position of improved yield.

2. The system as set forth in claim 1 wherein when said processor means for determining from said stored information representing yield curves that the current position of the contour edge feature of said predicted layout pattern is at a position that provides acceptable yield, said processor means terminates sampling from the location position.

3. The system as set forth in claim 1 wherein when said processor means for determining operates to determine that the current position of the contour edge feature of the predicted layout pattern is at a position within acceptable proximity to said corresponding edge position of said design layout pattern without having reached acceptable yield, said processor means marks said current location as a failed yield location and terminates sampling from the local position.

4. The system as set forth in claim 1 wherein said stored information representing said yield function represents a single yield curve that is a function of the distance of movement of the design edge from its original design position.

5. A computer program product stored on a computer readable storage device executable by a computer processor, said program product configured to create a pattern for a mask adapted for use in lithographic production of integrated circuits on a semiconductor substrate, the mask pattern being of a layout to be created on the substrate using the mask, said computer program product comprising:
    computer readable program code means determining distance values between corresponding edge features on a predicted layout pattern derived from a design layout pattern and on said design layout pattern;
    computer readable program code means for establishing information representing yield curves based upon said distance values; and
    computer readable program code means for comparing distance values related to edge features at selected locations on said predicted layout pattern with corresponding values on said yield curves to determine the yield for such selected locations.

6. A program storage device readable by a machine, tangibly embodying a program of instructions executable by the machine to perform method steps for creating a pattern for a mask adapted for use in lithographic production of integrated circuits on a semiconductor substrate, the mask pattern being of a design layout pattern to be created on the substrate using the mask, said method steps comprising:

determining distance values between corresponding edge features on a predicted layout pattern derived from said design layout pattern and on said design layout pattern;

establishing information representing yield curves based upon said distance values; and comparing distance values related to edge features at selected locations on the said predicted layout pattern with corresponding values on said yield curves to determine the yield for such selected locations.

* * * * *